United States Patent
Chiang

(10) Patent No.: US 6,667,874 B2
(45) Date of Patent: Dec. 23, 2003

(54) STRUCTURE FOR ELIMINATING ELECTROMAGNETIC INTERFERENCE CAUSED BY CENTRAL PROCESSING UNIT

(75) Inventor: Kuei-feng Chiang, Pingtung Hsien (TW)

(73) Assignee: Asia Vital Components Co., Ltd., Kaohsiung (TW)

(*) Notice: Subject to any disclaimer, the term of this patent is extended or adjusted under 35 U.S.C. 154(b) by 151 days.

(21) Appl. No.: 10/045,005

(22) Filed: Jan. 15, 2002

(65) Prior Publication Data
US 2003/0133248 A1 Jul. 17, 2003

(51) Int. Cl.[7] .................................................. H05F 3/00
(52) U.S. Cl. .................. 361/213; 361/214; 361/704; 361/784; 361/792; 174/15.2; 174/16.3
(58) Field of Search ................................ 361/213, 214, 361/215, 816, 818, 704, 784, 792, 790, 764; 174/16.3, 15.2

(56) References Cited

U.S. PATENT DOCUMENTS

| | | | | |
|---|---|---|---|---|
| 5,949,648 | A | * | 9/1999 | Liao |
| 6,208,516 | B1 | * | 3/2001 | Fangonilo et al. |
| 6,477,058 | B1 | * | 11/2002 | Luebs et al. |
| 6,518,660 | B2 | * | 2/2003 | Kwon et al. |

* cited by examiner

Primary Examiner—Dean A. Reichard
Assistant Examiner—Nguyen T. Ha
(74) Attorney, Agent, or Firm—Bacon & Thomas, PLLC

(57) ABSTRACT

A structure for eliminating electromagnetic interference caused by CPU includes a fixing seat, onto which two conductive members having a plurality of elastic contacts are mounted. Each of the conductive members is formed at two ends with two contact wings that are in contact with contacts of a demagnetizing circuit provided on a circuit board onto which the fixing seat is assembled with fastening members. When a central processing unit mounted on the circuit board operates and generates electromagnetic waves, the same are received by a radiator mounted on the fixing seat in contact with the conductive members, and then guided by the conductive members from the radiator to the demagnetizing circuit and be eliminated.

4 Claims, 4 Drawing Sheets

STRUCTURE FOR ELIMINATING ELECTROMAGNETIC INTERFERENCE CAUSED BY CENTRAL PROCESSING UNIT

FIELD OF THE INVENTION

The present invention relates to a structure for eliminating electromagnetic interference caused by a central processing unit, and more particularly to a structure using conductive members to guide electromagnetic wave generated by a central processing unit and transferred to a radiator to a demagnetizing circuit on a circuit board, so as to eliminate the electromagnetic interference caused by the central processing unit.

BACKGROUND OF THE INVENTION

All currently available electronic products include a circuit board on which various kinds of electronic parts are provided. These electronic parts generate high-frequency electromagnetic waves when they operate. Electromagnetic waves interfere with one another to adversely affect or even result in failure of the functions of the electronic parts and cause confusions in using the electronic products.

For a central processing unit (CPU) of a computer to have an increased processing speed, it is now a common way to rapidly increase the frequency thereof. Currently, the CPU usually has a frequency of more than 1 GHz. However, while a high-frequency CPU has correspondingly increased processing speed, it also generates electromagnetic waves that inevitably interfere with the performance of various electronic parts and circuits on the circuit board. That is, the high-frequency CPU would cause the so-called electromagnetic interference (EMI) and results in extremely unstable operation of the computer.

Since the CPU of the computer is constantly improved, it is doubtless the frequency of the CPU would keep increasing and cause even more serious EMI. It is therefore an important issue among the electronic industry to exactly and effectively eliminate the electromagnetic waves generated by the CPU.

SUMMARY OF THE INVENTION

A primary object of the present invention is to provide a structure for eliminating electromagnetic interference caused by a CPU, so that electronic parts and circuits in the vicinity of the CPU are protected against EMI and the computer is protected from abnormal operation by guiding electromagnetic waves generated by the CPU to a demagnetizing circuit on the circuit board and be demagnetized.

BRIEF DESCRIPTION OF THE DRAWINGS

The structure and the technical structure adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
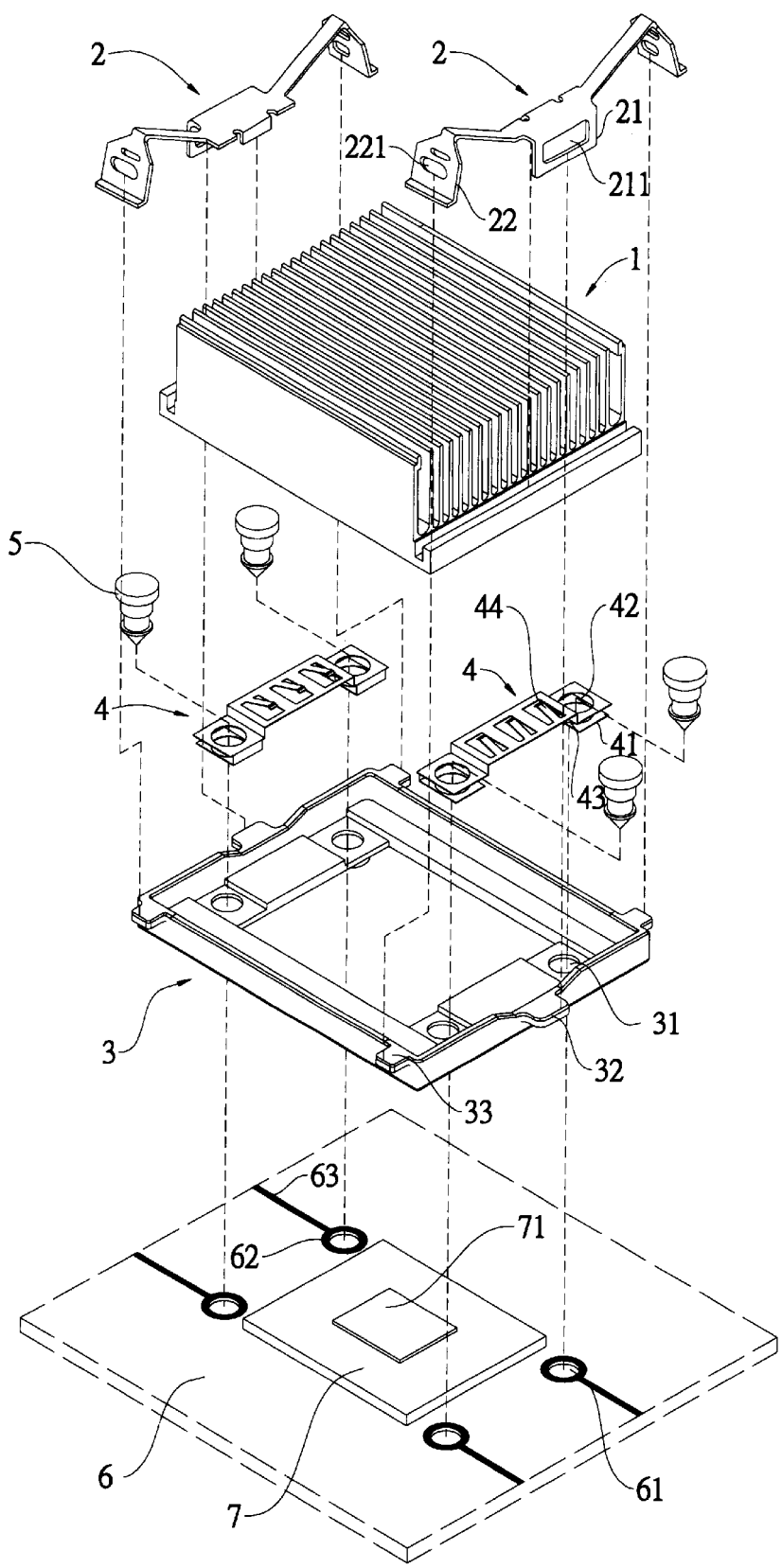
FIG. 1 is an exploded perspective view of the present invention.
Figure 2:
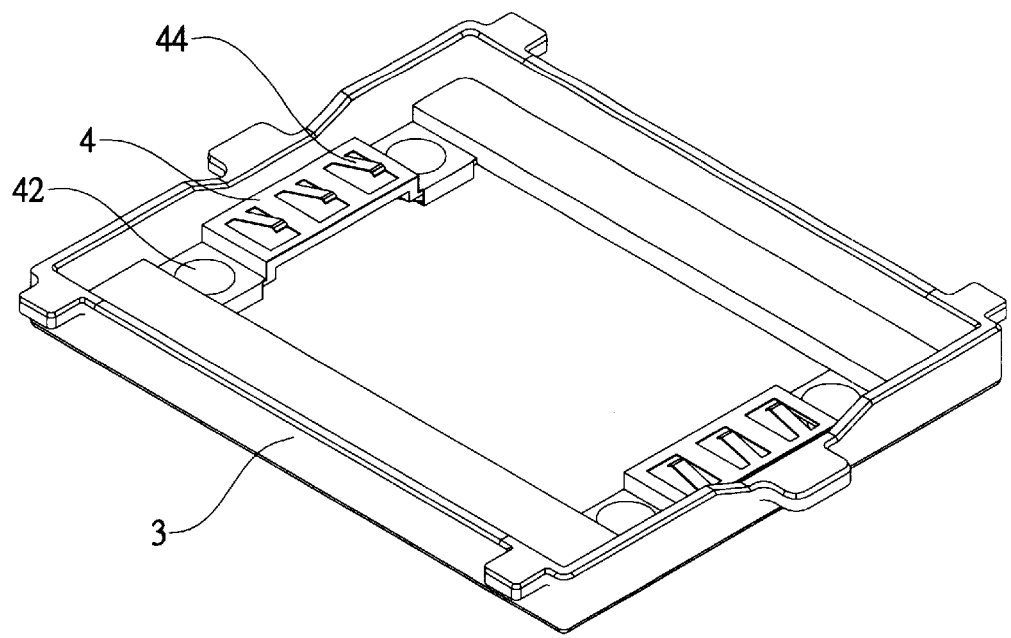
FIG. 2 is a perspective view of a fixing seat of the present invention with two conductive members assembled thereto.

Please refer to FIG. 1 that is an exploded perspective view of a structure according to a preferred embodiment of the present invention for eliminating electromagnetic interference caused by a CPU. As shown, the structure includes a radiator 1, two binding members 2, a fixing seat 3, two conductive members 4, four fastening members 5, a circuit board 6, and a central processing unit (CPU) 7 mounted on the circuit board 6.

Figure 3:
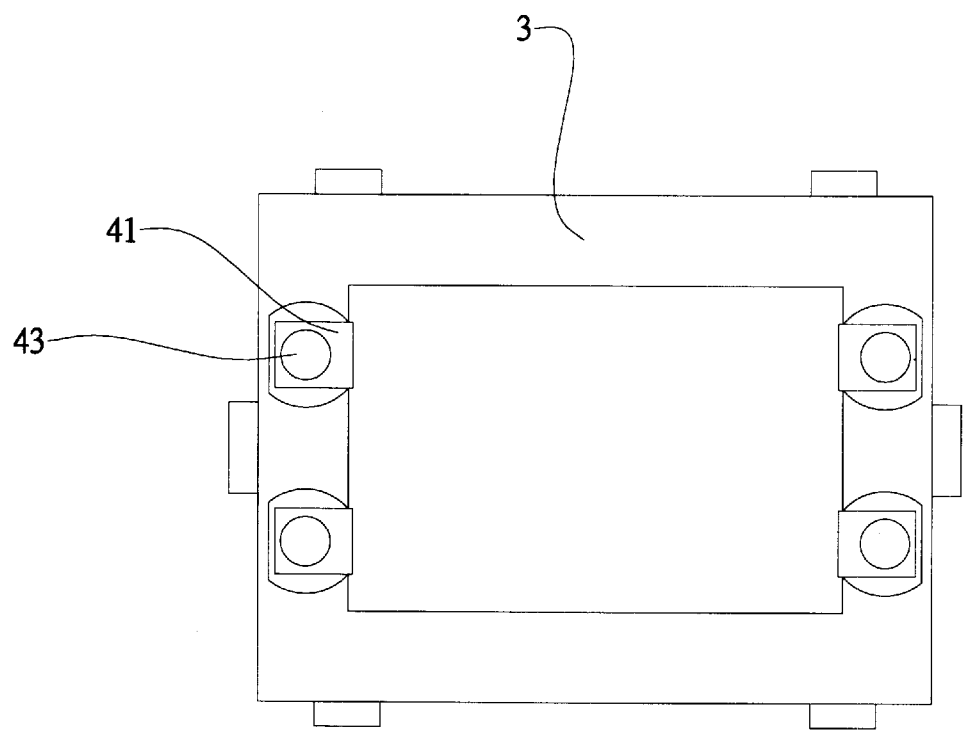
FIG. 3 is a bottom view of FIG. 2.
Figure 4:
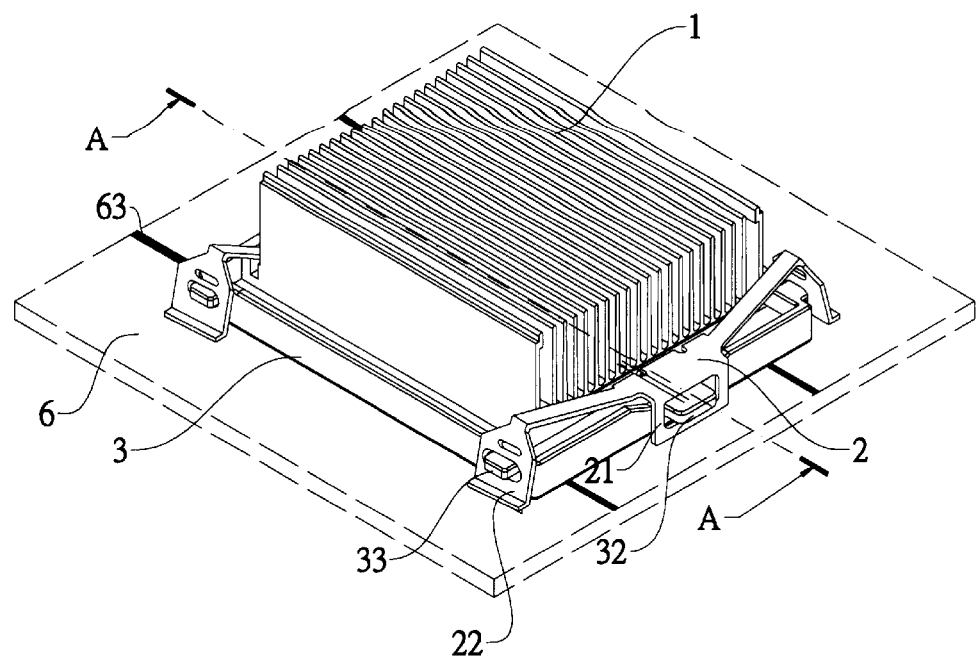
FIG. 4 is an assembled perspective view of FIG. 1.

Please refer to FIGS. 1 to 4 at the same time. The two conductive members 4 are mounted on a top of the fixing seat 3. Each of the two conductive members 4 includes a plurality of conductive contacts. In the illustrated preferred embodiment of the present invention, the conductive contacts are in the form of elastic and inclined strips 44 upward projected from the conductive members 4. Each conductive member 4 also includes two contact wings 41 integrally formed below two ends of the conductive member 4 by vertically downward extending and then horizontally bending one side of each end. The conductive member 4 is mounted onto the fixing seat 3 with the contact wings 41 located below a bottom of the fixing seat 3 to align with mounting holes 31 preformed on the fixing seat 3, as shown in FIG. 3. Each conductive member 4 is provided at two ends and the two contact wings 41 with first and second openings 42 and 43, respectively, such that the first opening 42, the mounting hole 31, and the second opening 43 at each end of the conductive member 4 are aligned with one another to provide a through passage when the conductive member 4 is mounted onto the fixing seat 3, allowing the fastening members 5 to downward extend through the passages into holes 61 preformed on the circuit board 6 and thereby enable each of the contact wings 41 of the conductive members 4 to contact with a contact 62 of a demagnetizing circuit 63 provided around each hole 61.

Each of the binding members 2 includes a first tab 21 having a first opening 211 adapted to engage with a first lug 32 on the fixing seat 3 and two second tabs 22 having a second opening 221 each adapted to engage with a second lug 33 on the fixing seat 3. The radiator 1 is firmly mounted to the top of the fixing seat 3 above the conductive members 4 with the binding members 2 through engagement of first openings 211 with the first lugs 32 and the second openings 221 with the second lugs 33.

Figure 5:
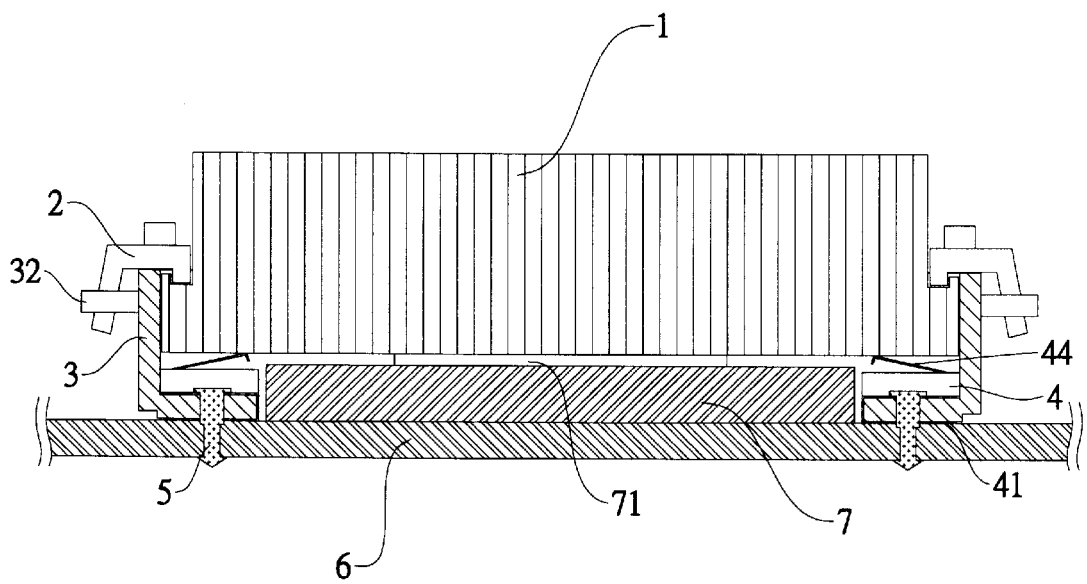
FIG. 5 is a sectional view taken on line A—A of FIG. 4.

Please refer to FIGS. 1 and 5. When the radiator 1 is firmly assembled to the fixing seat 3 with the binding members 2, a bottom of the radiator 1 is pressed against the elastically projected strips 44 on the conductive members 4. At this point, the elastic strips 44 generate a spring-back force that enables the strips 44 to firmly contact with the bottom of the radiator 1. Since the contact wings 41 of the conductive members 4 are in contact with the contacts 62 of the demagnetizing circuit 63 on the circuit board 6, a close circuit is formed between the conductive members 4 and the demagnetizing circuit 63. When a chip 71 of the high-frequency CPU 7 operates, the electromagnetic waves generated by the chip 71 are received by the radiator 1 and then directed to the demagnetizing circuit 63 on the circuit board 6 through the conductive members 4 and finally eliminated.

Figure 6:
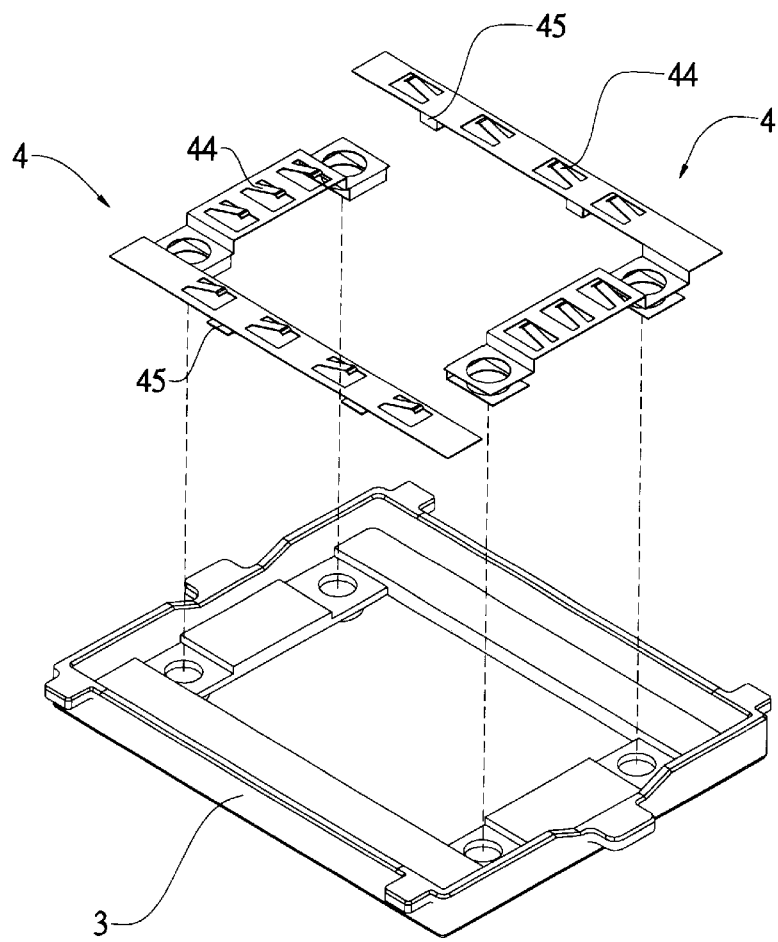
FIG. 6 is an exploded perspective view showing another form of the conductive members for assembling to the fixing seat of the present invention.
Figure 7:
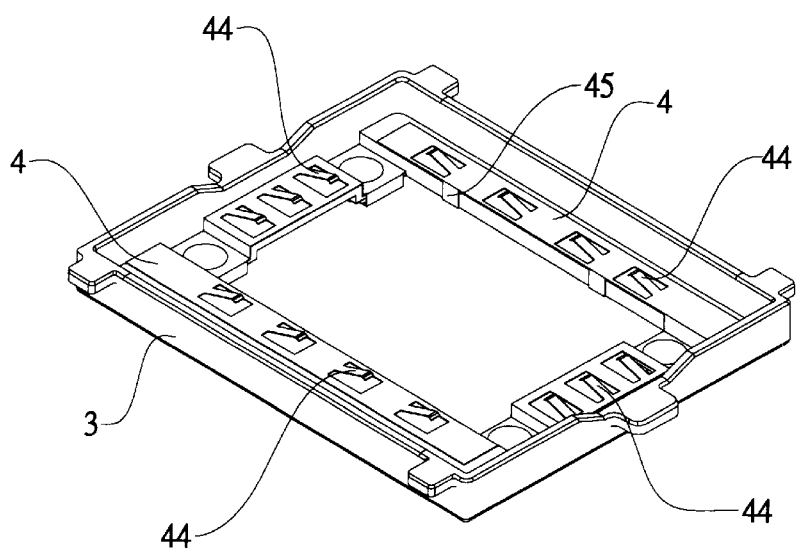
FIG. 7 is an assembled perspective view of FIG. 6.

Please refer to FIGS. 6 and 7. To enable better utilization of available space in the fixing seat 3 and to enable expanded range and effect of guiding the electromagnetic waves, the present invention provides a second embodiment of the conductive member 4 in the form of a letter "L". Each L-shaped conductive member 4 is also provided with a plurality of elastically projected strips 44. When the two L-shaped conductive members 4 are mounted on the fixing seat 3, they are able to guide electromagnetic waves over the entire fixing seat 3 to create an enhanced demagnetizing effect. To enable stable connection of the L-shaped conductive members 4 to the fixing seat 3, the conductive members 4 are provided along an edge at predetermined positions with bent legs 45 for clamping the conductive members 4 to the fixing seat 3, as shown in FIG. 7.

In conclusion, the present invention provides a structure for eliminating electromagnetic interference caused by a CPU. The structure includes a radiator that receives electromagnetic waves generated by the CPU, and conductive members that guide the electromagnetic waves from the radiator to a demagnetizing circuit on a circuit board on which the CPU is mounted. Thus, various electronic parts and circuits on the circuit board are protected against electromagnetic interference to maintain stable and quick operation of the computer.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A structure for eliminating electromagnetic interference caused by CPU, comprising a fixing seat, a plurality of conductive members, a radiator, a circuit board, and a central processing unit (CPU); said CPU being mounted on said circuit board and generating electromagnetic waves during operation thereof; each of said conductive members including a plurality of conductive contacts and two contact wings formed by vertically downward extending and then horizontally bent one side of two ends of each said conductive member, said conductive members being assembled to a top of said fixing seat with said contact wings located below a bottom of said fixing seat to contact with contacts of a demagnetizing circuit provided on said circuit board after said fixing seat is fastened to said circuit board; and said radiator being mounted on the top of said fixing seat to contact with said conductive contacts on said conductive members and adapted to receive said electromagnetic waves generated by said CPU; whereby said electromagnetic waves generated by said CPU and received by said radiator are guided by said conductive members to said demagnetizing circuit on said circuit board and be eliminated.

2. The structure for eliminating electromagnetic interference caused by CPU as claimed in claim 1, wherein said two contact wings of each said conductive member are in alignment with a bottom side of two mounting holes preformed on said fixing seat, and said two ends and said two contact wings of each said conductive member being formed of first and second openings, respectively, and said first and said second openings at each end of each said conductive member together with a corresponding one of said mounting holes on said fixing seat forming a vertical through passage via which a fastening member is downward extended into a corresponding hole preformed on said circuit board to ensure firm contact of said contact wings with said contacts of said demagnetizing circuit provided around said holes preformed on said circuit board.

3. The structure for eliminating electromagnetic interference caused by CPU as claimed in claim 1, wherein said conductive contacts on each said conductive member are elastic strips inclinedly upward projected from said conductive member; and said elastic strips being in firm contact with a bottom of said radiator to enable effective guiding of said electromagnetic waves when said radiator is assembled to the top of said fixing seat with binding members.

4. The structure for eliminating electromagnetic interference caused by CPU as claimed in claim 1, wherein each of said conductive members is provided along an edge at predetermined positions with a plurality of bent legs for clamping said conductive member to said fixing seat.

* * * * *